United States Patent
Zenz et al.

(10) Patent No.: US 9,425,500 B2
(45) Date of Patent: Aug. 23, 2016

(54) ANTENNA OR A STRAP FOR ACCOMMODATING AN INTEGRATED CIRCUIT, AN ANTENNA ON A SUBSTRATE, A STRAP FOR AN INTEGRATED CIRCUIT AND A TRANSPONDER

(75) Inventors: Christian Zenz, Graz (AT); Dietmar Nessmann, Graz (AT)

(73) Assignee: NXP B.V., Eindhoven (NL)

( * ) Notice: Subject to any disclaimer, the term of this patent is extended or adjusted under 35 U.S.C. 154(b) by 815 days.

(21) Appl. No.: 12/744,356

(22) PCT Filed: Nov. 21, 2008

(86) PCT No.: PCT/IB2008/054899
§ 371 (c)(1),
(2), (4) Date: May 24, 2010

(87) PCT Pub. No.: WO2009/069053
PCT Pub. Date: Jun. 4, 2009

(65) Prior Publication Data
US 2010/0253589 A1  Oct. 7, 2010

(30) Foreign Application Priority Data

Nov. 26, 2007 (EP) ...................................... 07121512

(51) Int. Cl.
*H01Q 1/50* (2006.01)
*H01Q 1/38* (2006.01)
*G06K 19/077* (2006.01)
*H01Q 1/22* (2006.01)
*H01Q 9/28* (2006.01)

(52) U.S. Cl.
CPC .............. *H01Q 1/38* (2013.01); *G06K 19/0775* (2013.01); *G06K 19/07749* (2013.01); *G06K 19/07786* (2013.01); *H01Q 1/22* (2013.01); *H01Q 9/285* (2013.01); *H01L 2224/16225* (2013.01); *H01L 2224/16227* (2013.01); *Y10T 29/49018* (2015.01)

(58) Field of Classification Search
CPC ........ H01Q 13/10; H01Q 13/106; H01Q 1/38
USPC ............. 343/906, 767, 700 MS; 29/601, 600, 29/829, 832, 842, 854
See application file for complete search history.

(56) References Cited

U.S. PATENT DOCUMENTS

| 6,078,791 A * | 6/2000 | Tuttle et al. .................. 455/90.1 |
| 6,518,885 B1 * | 2/2003 | Brady et al. ............... 340/572.7 |
| 2003/0102961 A1 * | 6/2003 | Fischer et al. ............... 340/10.1 |
| 2003/0112202 A1 * | 6/2003 | Vogt ................. G06K 19/07718 343/873 |
| 2005/0212131 A1 * | 9/2005 | Kawai ........................... 257/737 |

(Continued)

FOREIGN PATENT DOCUMENTS

| EP | 1653506 A1 | 5/2006 |
| EP | 1724712 A1 | 11/2006 |

(Continued)

*Primary Examiner* — Dameon E Levi
*Assistant Examiner* — Collin Dawkins

(57) ABSTRACT

In a method of manufacturing an antenna (11) formed on a substrate (1) an antenna structure (2) is formed on the substrate (1). The antenna structure (2) comprises an area (3) which initially is electrically short-circuited and is designed to be turned into an antenna contact (4a,4b) to be contacted with contacts (12,13) of an integrated circuit (IC). The antenna contact (4a,4b) is formed by mechanically separating the electrically short-circuited 5 area (3) particularly utilizing cutting or stamping means (5).

12 Claims, 6 Drawing Sheets

(56) References Cited

U.S. PATENT DOCUMENTS

| | | | |
|---|---|---|---|
| 2005/0284917 A1* | 12/2005 | Clare et al. .................... | 228/170 |
| 2006/0001154 A1* | 1/2006 | Stoneham et al. ............ | 257/723 |
| 2006/0261456 A1* | 11/2006 | Steffen ................. | G06K 19/077 |
| | | | 257/679 |
| 2007/0040686 A1 | 2/2007 | Reis | |
| 2007/0257670 A1* | 11/2007 | Giaquinto ........ | G01R 33/34007 |
| | | | 324/300 |

FOREIGN PATENT DOCUMENTS

| | | | |
|---|---|---|---|
| EP | 1930844 A1 | 6/2008 | |
| WO | 9967754 A1 | 12/1999 | |
| WO | 2006/002335 A1 | 1/2006 | |
| WO | 2006/017401 A2 | 2/2006 | |
| WO | 2007051110 A2 | 5/2007 | |
| WO | WO 2007060630 A1 * | 5/2007 | ........... G06K 19/077 |

\* cited by examiner

2

ANTENNA OR A STRAP FOR ACCOMMODATING AN INTEGRATED CIRCUIT, AN ANTENNA ON A SUBSTRATE, A STRAP FOR AN INTEGRATED CIRCUIT AND A TRANSPONDER

FIELD OF THE INVENTION

The invention relates to methods of manufacturing an antenna or a strap for accommodating an integrated circuit, an antenna on a substrate, a strap for an integrated circuit, and a transponder.

BACKGROUND OF THE INVENTION

Transponders, which are also referred to as tags or labels, are well known in the art from, for instance, U.S. Pat. No. 6,078,791, and are designed to communicate with a reader, which is also known as a base station. Usually, the transponder comprises an integrated circuit and an antenna to capture signals sent by the reader. The antenna is formed on a substrate, which is, for instance, a plastic foil. The antenna usually is connected to the integrated circuit by means of contacts. Alternatively, the transponder may include a strap, also called an interposer, which is connected to the integrated circuit and to the antenna. Then, the antenna may be formed on a separate antenna substrate.

The ever-decreasing size of integrated circuits potentially complicates manufacturing suitable antenna or strap contacts configured to be contacted with the contacts of the integrated circuits.

OBJECT AND SUMMARY OF THE INVENTION

It is an object of the present invention to provide a method of manufacturing an antenna formed on a substrate and/or a method for manufacturing a strap for accommodating an integrated circuit.

The object is achieved in accordance with the invention by means of a method of manufacturing an antenna formed on a substrate, comprising the steps of:

forming an antenna structure on a substrate; the antenna structure comprising an area which is electrically short-circuited and is designed to be turned into an antenna contact to be contacted with contacts of an integrated circuit; and forming the antenna contact by mechanically separating the electrically short-circuited area.

The object is also achieved in accordance with the invention by means of a method of manufacturing a strap for accommodating an integrated circuit, comprising the steps of:

forming a conductive structure on a strap substrate; the conductive structure comprising an area which is electrically short-circuited and is designed to be turned into strap contacts to be contacted with contacts of an integrated circuit, and the conductive structure being designed to be contacted with an antenna; and forming the strap contacts by mechanically separating the electrically short-circuited area.

In another aspect of the invention, a system comprises a substrate and an antenna formed on the substrate; wherein the antenna comprises antenna contacts, which are configured to be contacted with contacts of an integrated circuit and have been mechanically separated.

This system can be used for a transponder, which comprises an integrated circuit, whose contacts are contacted with the antenna contacts.

In a further aspect of the invention, a strap comprises a strap substrate and a conductive structure formed on the strap substrate; wherein the conductive structure comprises strap contacts, which are configured to be contacted with contacts of an integrated circuit and have been mechanically separated, and the conductive structure being designed to be contacted with an antenna.

This strap can be used to form a transponder, which comprises an integrated circuit, whose contacts are contacted with the strap contacts, and an antenna connected to the conductive structure of the strap.

The antenna structure or the conductive structure of the strap is particularly formed on the respective substrate by conventional methods. The conventional methods can be classified as additive or subtractive manufacturing methods. When utilizing an additive method, then the antenna structure or the conductive structure may be formed on the respective substrate by means of printing the conductive layer or by means of printing a resist with a subsequent sputtering or evaporating process. In that case, the structure of the printed resist corresponds to the inverse pattern of the conductive or antenna structure and the substrate is, for instance, a plastic foil. When utilizing a subtractive manufacturing method, then the substrate may be laminated with a conductive layer made, for instance, from aluminum or copper. Then, a negative resist corresponding to the antenna structure or the conductive structure of the strap is printed on the conductive layer, and the antenna structure or the conductive structure is formed utilizing an etching step.

The antenna or conductive structure comprises antenna or strap contacts, respectively, which are designed to be contacted with respective contacts of an integrated circuit. When manufacturing the antenna or the conductive structure in a conventional manner, the antenna or strap contacts are formed simultaneously with the remaining structure and are thus electrically separated. According to the inventive methods, however, the corresponding areas of the antenna or strap structures, which are meant to be the antenna or strap contacts, are initially short-circuited. In order to form individual antenna or strap contacts, this area is then mechanically separated. The individual contacts then can be contacted with the contacts of the integrated circuits in order to form a transponder.

The antenna may particularly be a high frequency (HF), ultra high frequency (UHF), dipole, multipole or closed loop antenna. Since, according to the inventive methods, the antenna or strap contacts are finally made utilizing the mechanical separation step, relative small gaps between the antenna or strap contacts can be made in a relative simple and inexpensive manner, thus allowing the use of relative small integrated circuits with relative small spaces between the contacts. Utilizing the inventive mechanical separating step, the distance between two consecutive contacts of the integrated circuits can be 130 µm or lower.

The mechanically separating may particularly be performed utilizing cutting or shearing means, for instance, a suitable knife or scissors. Then, a single cut may form a gap cut into the antenna or conductive structure around the area meant for the antenna or strap contacts. Then, the gap separates the individual antenna or strap contacts.

The mechanically separating may also be performed utilizing stamping means, such as a suitable machine or stamping press. Stamping is a process by which strips or gaps are punched using a press tool, which is loaded on the machine, or stamping press. Utilizing the stamping means may result in more complex separating structures, such as a cross, in particular only one punch.

When mechanically separating the areas, the relevant substrate underneath may also be separated. Alternatively, the mechanically separating may be performed such that only the area is mechanically separated without separating the relevant substrate. This is also known as "kiss-cutting".

In order to widen the gap between the antenna or strap contacts after the mechanically separating step, the relevant substrate may be stretched by means of stretching means or by applying an etching step. Utilizing the etching step, material of the antenna or conductive structure around the gap is etched away. This widening step is of particular advantage if the cutting or stamping step does not involve a loss of material. Mechanical separating methods without loss of material are cutting or shearing, whereas stamping usually involves such a loss, i.e. the cuttings which fall into the wastebasket. However, in reality also mixtures of the separating methods are used wherein, for example, a cross-shaped stamping tool forms a cross-shaped cut without loss of material. In that sense, the tool may also be termed as cross-shaped knife.

In one embodiment, markers are formed on the relevant substrate simultaneously when mechanically separating the electrically short-circuited area. The markers may be optical markers for a subsequent process, during which the integrated circuit is mounted on the substrate or strap substrate for contacting its contacts with the antenna or strap contacts. Forming the markers on the substrate simultaneously when forming the antenna or strap contacts reduces the time for the entire assembling and manufacturing process of an associated transponder. These markers may particularly be formed by stamping means.

In one embodiment, an integrated circuit is placed on the substrate simultaneously when mechanically separating the area for forming the antenna or strap contacts, respectively. In that case, the separation tool and the placing unit are integrated in a single station with fixed distance between the separation tool and the place unit. Once the separation tool has punched the die landing area, the positioning of the place unit can be done in a simple displacement of the station by the known aforementioned distance between the separation tool and the place unit to significantly reduce the time for positioning the place unit.

Particularly, separating the area for forming the antenna or strap contacts and forming the markers on the relevant substrate are carried out by means of a single mechanical tool, particularly by a single stamping means. When utilizing the single stamping means, these means can be designed to stamp simultaneously the gap into the antenna or conductive structure and to stamp the markers into the relevant substrate.

The mechanical separating step may be integrated into an entire process of manufacturing a transponder, may immediately precede a mounting step, during which the contacts of the integrated circuit are contacted with the antenna or strap contacts, or may be carried out off-line.

It is also possible to form contact pads for additional components, such as sensors, batteries, and displays. Particularly, more than four pads can be formed.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 5:
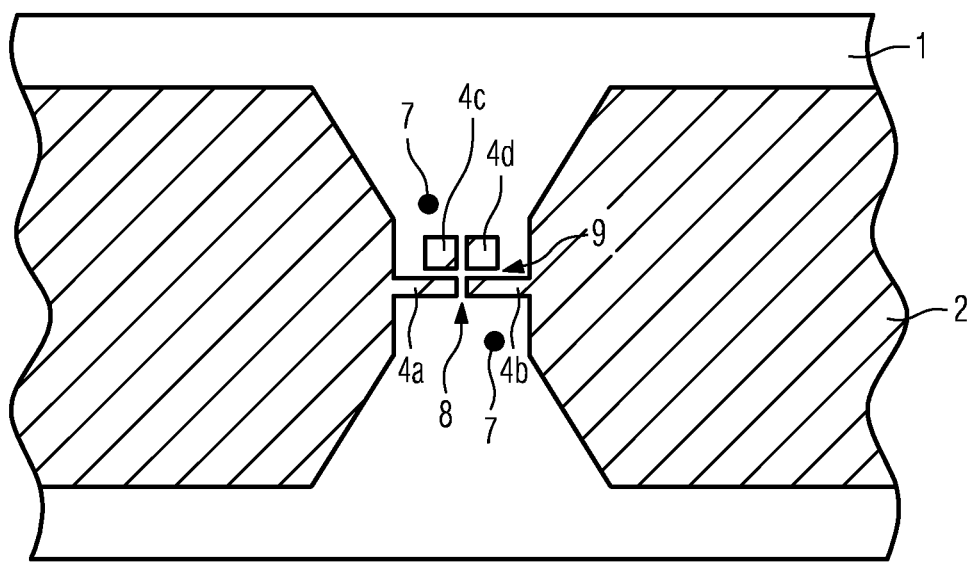
Figure 6:
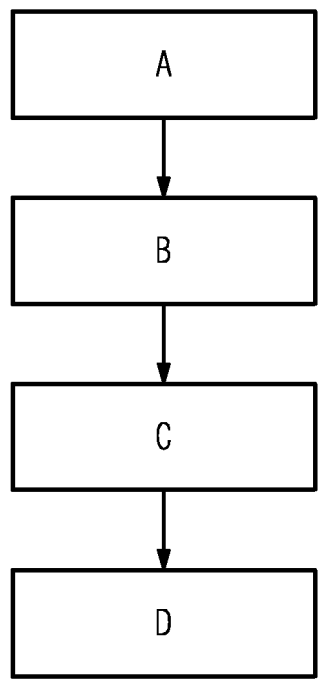
FIG. 6 is a flow chart summarizing the manufacturing of the antenna.

FIGS. 1 to 5 show different stages of a process to manufacture an antenna 11 on a substrate 1, and FIG. 6 depicts a flow chart summarizing the individual manufacturing steps.

Firstly, an antenna structure 2 is formed on the substrate 1 particularly utilizing a conventional method (step A in FIG. 6). The antenna structure 2 is, for instance, printed on the substrate 1. Alternatively, a resist corresponding to the inverse antenna structure 2 is formed on the substrate 1 by utilizing, for instance, a printing step. Then, the antenna structure 2 may be formed by a subsequent sputtering process. The antenna structure 2, however, may also be formed on the substrate 1 by utilizing a laminated substrate, i.e. a substrate which is laminated by an electric conductive layer made form, for instance, aluminum or copper. Then, a resist corresponding to the inverse antenna structure 2 is printed on the conductive layer, and the antenna structure 2 is formed utilizing an etching step.

The antenna structure 2 comprises an area 3, which will be turned into antenna contact pads 4a, 4b as shown in FIG. 5.

Figure 1:
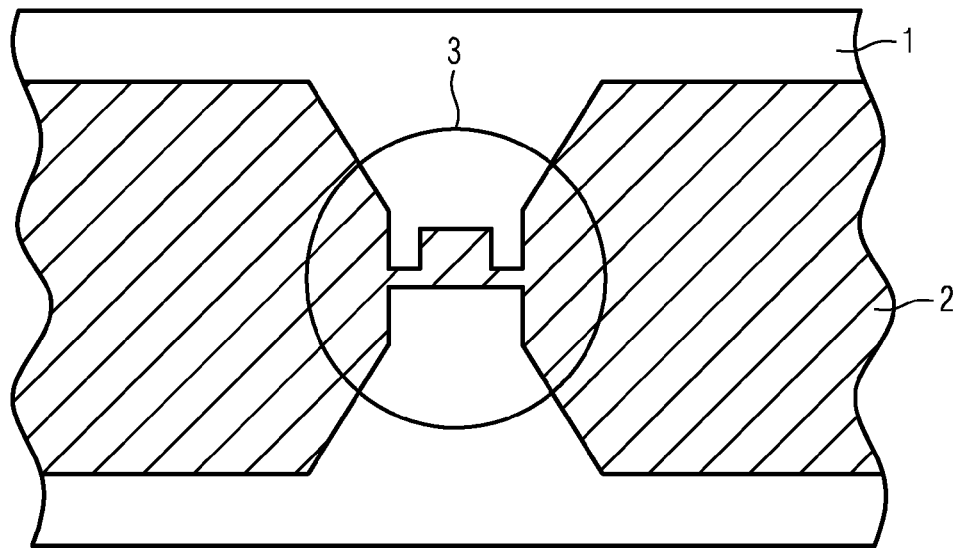
FIGS. 1 to 5 illustrate the manufacturing of an antenna formed on a substrate.
Figure 2:
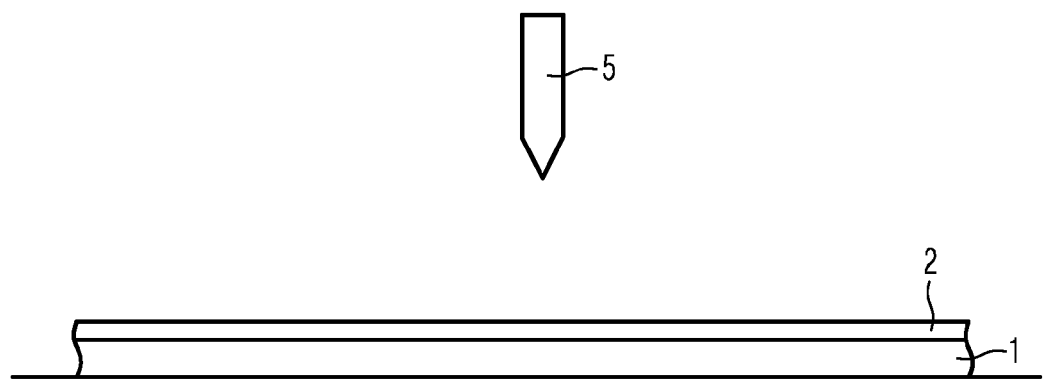

As it is evident from FIG. 1, the area 3 initially is short-circuited, i.e. forms one continuous area and shall be turned into four separate contact pads 4a-4d, which are electrically separated. Two of the contact bumps are the antenna contact pads 4a, 4b. FIG. 2 shows a cut through the substrate 1 and the antenna structure 2 formed thereon around the area 3. The area 3 may also be called "die landing area", because an integrated circuit is meant to be mounted on area 3. Alternatively, more than four contact pads can be produced in such a manner that additional components such as batteries, sensors, display etc. may be connected to the integrated circuit.

Figure 3:
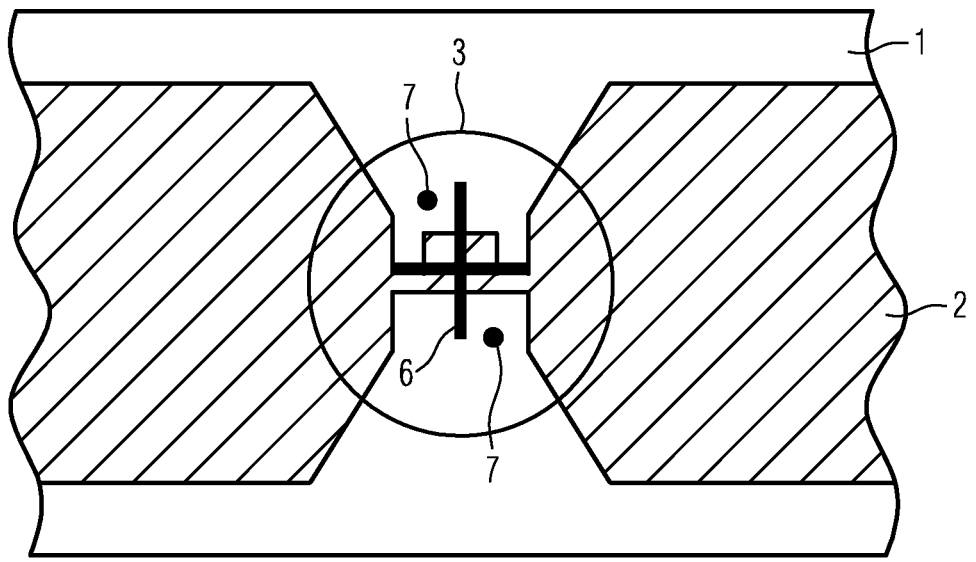
Figure 4:
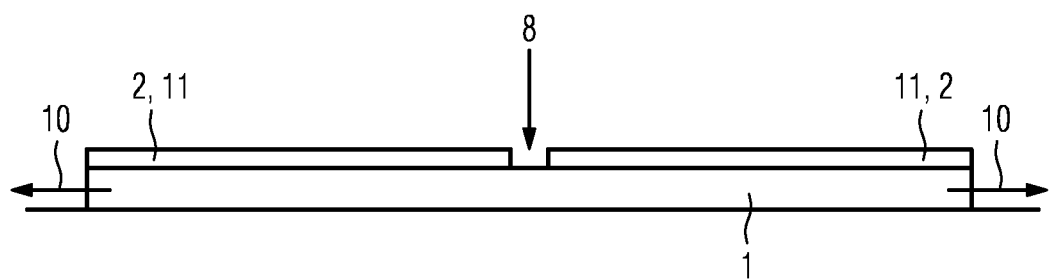

According to one embodiment, the contact pads 4a-4d and especially the antenna contact pads 4a, 4b are formed by mechanically separating the antenna structure 2 in the area 3 particularly by means of a cutting device, such as a knife, or a stamping device 5 as shown in FIG. 2 (step B in FIG. 6). The stamping device 5 may be designed to punch a cross-shaped structure 6 into the antenna structure 2. The cross-shaped structure 6 is shown in FIG. 3. Furthermore, the stamping device 5 may be configured to separate only the antenna structure 2 in the area 3 without cutting the substrate 1. If desired, the stamping device 5 can also be configured to cut through the substrate 1.

According to another embodiment, the stamping device 5 is further configured to punch markers 7 into the substrate 1 around the area 3 (step B in FIG. 6). Particularly, the stamping device 5 is designed to punch the cross-shaped structure 6 into the antenna structure 2 and the markers 7 into the substrate 1 simultaneously. These markers 7 may be optical markers supporting aligning the integrated circuit when mounted on the substrate 1.

Due to the cross-shaped structure 6 punched into the antenna structure 2, gaps 8 and 9 are formed into the antenna structure 2. The gaps 8 and 9 electrically separate the contact pads 4a-4d.

According to a preferred embodiment, the substrate 1 is stretched in the directions of arrows 10 in order to widen the gap 8, and in a direction perpendicular to the arrows 10 in order to widen the gap 9 (step C in FIG. 6). Instead of stretching the substrate 1, the gaps 8 and 9 may also be widened by applying an etching step about area 3. Then, the antenna structure 2 is turned into the antenna 11, which is a dipole antenna according to an embodiment. As mentioned, this widening step is of particular advantage if the separating step does not involve a loss of material.

Figure 7:
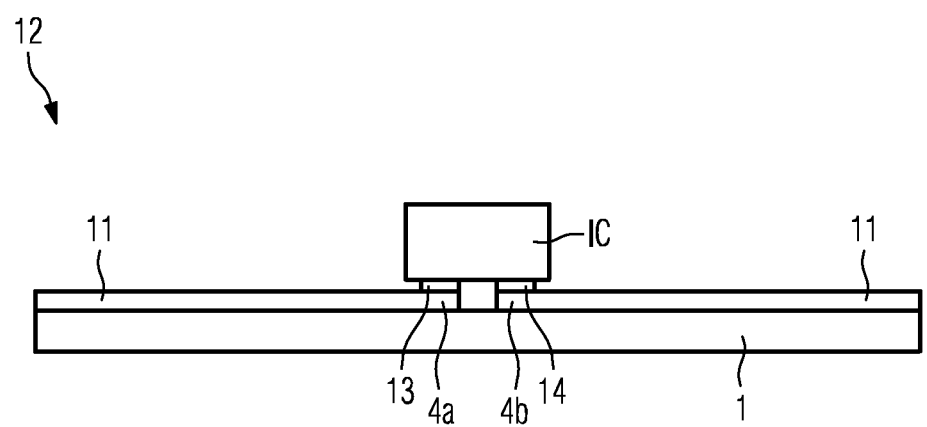
FIG. 7 is a transponder including the antenna.

In one embodiment, the antenna 11 formed on the substrate 1 is meant to be part of a transponder 12 shown in FIG. 7. In addition to the antenna 11 formed on the substrate 1, the transponder 12 comprises an integrated circuit IC. The integrated circuit IC incorporates the transponder functionalities, which are known to the skilled person per se and thus are not further explained.

According to another embodiment, the integrated circuit IC comprises two contact bumps 13, 14 and two test bumps, which are not shown. The integrated circuit IC is mounted on the antenna 11 in its die landing area 3 such that the contact bump 13 is electrically connected with the antenna pad 4a and the contact bump 14 is electrically connected with the antenna pad 4b, thus connecting the antenna 11 with the integrated circuit IC (step D in FIG. 6). The test bumps of the integrated circuit IC are connected with the contact pads 4c, 4d. For an improved alignment of the integrated circuit IC during the mounting step, the markers 7 are utilized.

Figure 8:
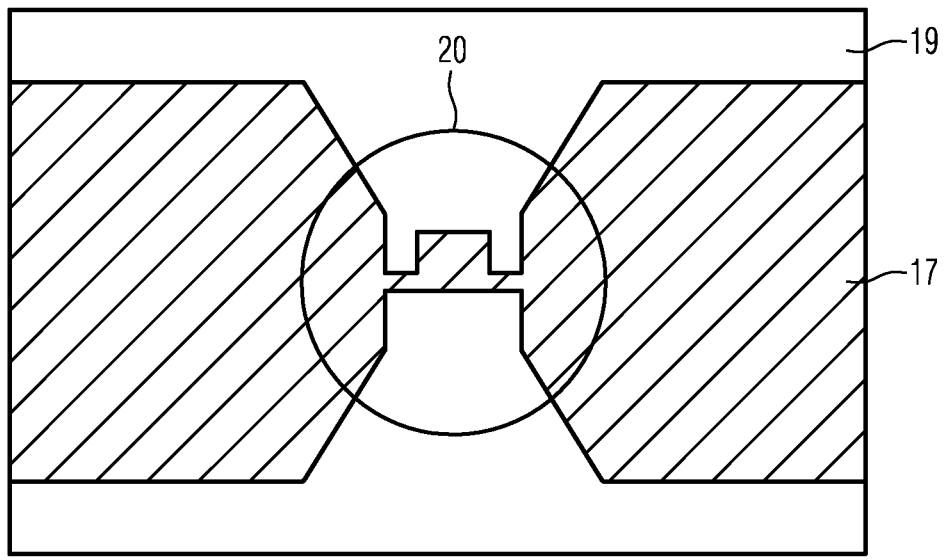
FIGS. 8 to 10 illustrate the manufacturing of a strap for accommodating an integrated circuit.
Figure 9:
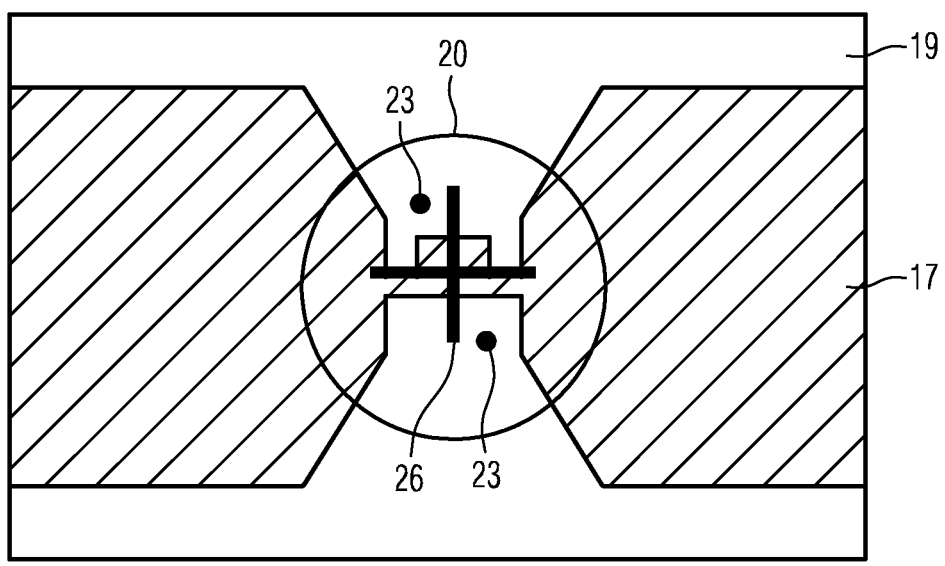
Figure 10:
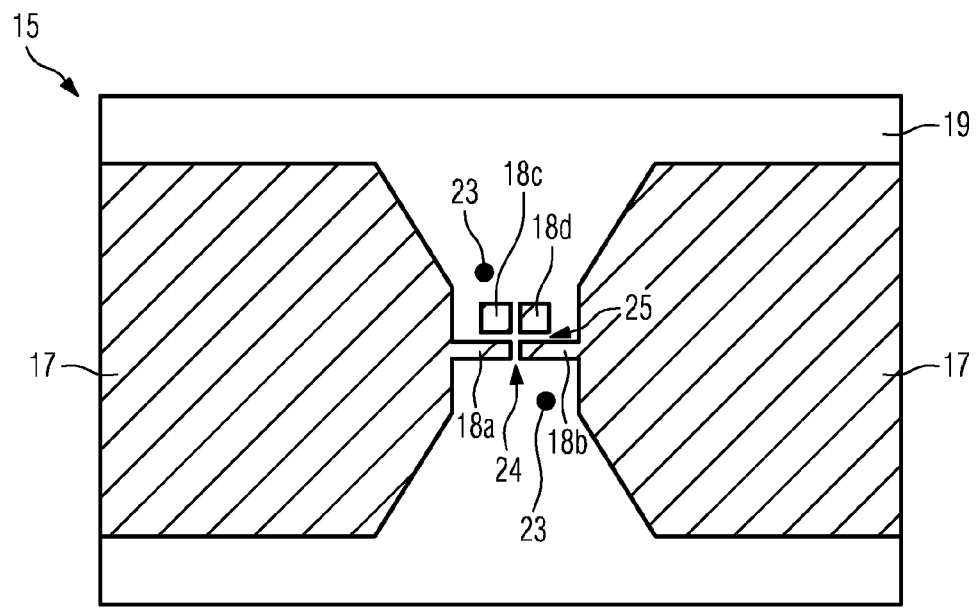
Figure 11:
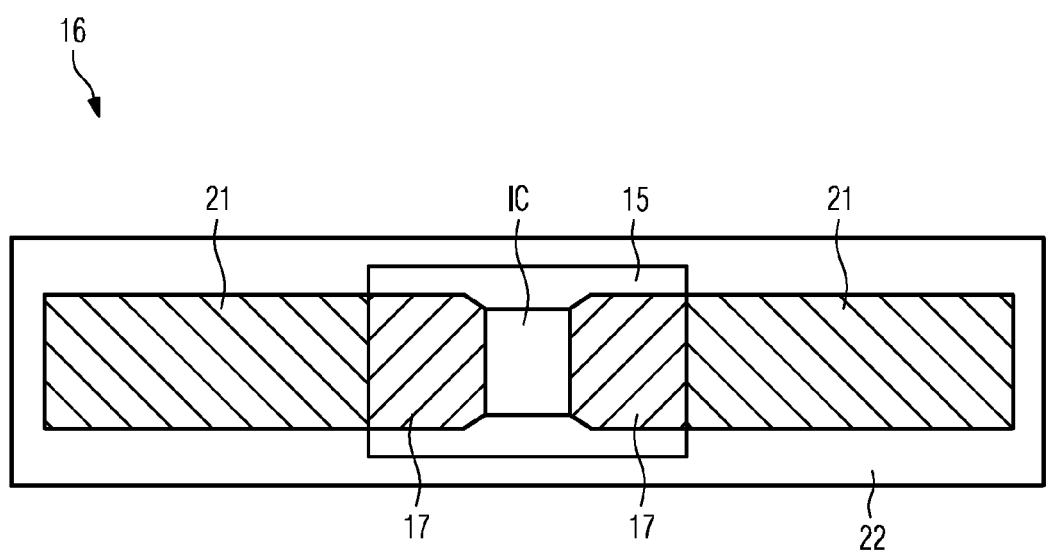
FIG. 11 is a transponder including the strap.

FIGS. 8 to 10 illustrate the manufacturing of a strap 15 meant for another transponder 16 depicted in FIG. 11. The strap 15 is designed to accommodate an integrated circuit, such as the integrated circuit IC for the transponder 12 shown in FIG. 7.

The strap 15 comprises a conductive structure 17, which includes pads 18a-18d and is formed on a strap substrate 19. When assembling the transponder 16, the integrated circuit IC is mounted on a die landing area 20, wherein the contact bump 13 of the integrated circuit IC contacts the pad 18a and the contact bump 14 of the integrated circuit IC contacts the pad 18b. The test bumps of the integrated circuit IC contact the pads 18c, 18d.

Furthermore, the transponder 16 comprises an antenna 21, which is formed on an antenna substrate 22. The strap 15 including the integrated circuit IC is attached to the antenna 21 such that the conductive structure 17 is connected with the antenna 21 so that the contacts 13, 14 of the integrated circuit IC are contacted with the antenna 21 via the conductive structure 17. Especially for UHF applications a conductive interconnection between the strap and the antenna is not mandatory, but can be achieved by capacitive or electromagnetic coupling.

According to a preferred embodiment, the strap 15 is manufactured as following:

Firstly, the conductive structure 17 is formed on the strap substrate 19 particularly utilizing a conventional method similar to forming the antenna structure 2 on the substrate 1. The conductive structure 17 comprises the area 20 which will be turned into the pads 18a-18d.

As it is evident from FIG. 8, the area 20 is initially short-circuited, i.e. forms one continuous area and shall be turned into four separate pads 18a-18d, which are electrically separated.

According to one embodiment, the contact pads 18a-18d are formed by mechanically separating the conductive structure 17 in the area 20 particularly by means of a cutting device, such as a knife, or the stamping device 5. The stamping device 5 may be designed to punch a cross-shaped structure 26 into the conductive structure 17. The cross-shaped structure 26 is shown in FIG. 9. Furthermore, the stamping device 5 may be configured to separate only the conductive structure 17 in the area 20 without cutting the strap substrate 19. If desired, the stamping device 5 can also be configured to cut through the strap substrate 19.

According to another embodiment, the stamping device 5 is further configured to punch markers 23 into the strap substrate 19 about the area 20. Particularly, the stamping device 5 is designed to punch the cross-shaped structure 26 into the strap structure 17 and the markers 23 into the strap substrate 19 simultaneously. The markers 23 may be optical markers supporting aligning the integrated circuit IC when mounted on the strap substrate 19.

Due to the cross-shaped structure 22 punched into the conductive structure 17, gaps 24, 25 are formed into the conductive structure 17. The gaps 24, 25 electrically separate the pads 18a-18d.

According to a preferred embodiment, the strap substrate 19 is stretched similar to the substrate 1 in order to widen the gaps 24, 25. Instead of stretching the strap substrate 19, the gaps 24, 25 may also be widened by applying an etching step about area 20.

Finally, it should be noted that the aforementioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprise" and its conjugations do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A method of manufacturing an antenna formed on a substrate, comprising the steps of:
    forming an antenna structure on a substrate, the substrate including a continuous area; and
    forming a cross-shaped structure including antenna contact pads and a die landing area by forming a cross-shaped cut in the continuous area and stretching the substrate to widen the cross-shaped cut to form the cross-shaped structure.

2. The method of claim 1, further including punching optical alignment markers on the substrate to assist in a mechanical separation of the continuous area; and
    wherein the forming of the cross-shape cut maintains an amount of material included in the continuous area.

3. The method of claim 2, wherein
    punching optical alignment markers and forming the cross-shaped structure are performed by a single mechanical tool; and
    further including a step of placing an integrated circuit on the substrate using the optical alignment markers to assist in mounting of the integrated circuit.

4. The method of claim 1, further including mechanically stretching the substrate after forming the antenna contact pads and applying an etching step after forming the antenna contacts in order to widen a gap between the antenna contacts.

5. The method according to claim 1, wherein the step of forming a cross-shaped structure includes utilizing a cutting means, shearing means, or stamping means.

6. A method of manufacturing a strap accommodating an integrated circuit, comprising the steps of:
    forming a conductive structure on a strap substrate;
    forming a cross-shaped structure including strap contacts by forming a cross-shaped cut in the conductive structure and stretching the strap substrate to widen the cross-shaped cut to form the cross-shaped structure;

forming optical alignment markers on the strap substrate; and placing an integrated circuit on the strap substrate using the optical alignment markers to assist in mounting of the integrated circuit.

7. The method of claim 6, wherein the step of forming optical alignment markers on the strap substrate is performed simultaneously with the step of forming a cross-shaped structure.

8. The method of claim 7, wherein forming the cross-shaped structure and forming the optical alignment markers on the strap substrate are performed by a single mechanical tool.

9. The method of claim 6, further including stretching the strap substrate after forming the cross-shaped structure by applying an etching step after forming the strap contacts in order to widen a gap between the strap contacts.

10. The method according to claim 6, wherein the step of forming a cross-shaped structure includes utilizing a cutting means, shearing means, or stamping means.

11. A strap for accommodating an integrated circuit comprising:

a strap substrate;

optical alignment markers on the substrate configured and arranged to assist in an antenna alignment; and a conductive structure formed on the strap substrate including strap contacts configured and arranged to contact an integrated circuit and gaps, the gaps and the strap contacts forming a mechanically separated cross-shaped structure and the conductive structure being configured and arranged to contact an antenna.

12. A transponder, comprising a strap of claim 11, an integrated circuit whose contacts are contacted with the strap contacts, and an antenna connected to the conductive structure of the strap.

* * * * *